(12) United States Patent
Inoue et al.

(10) Patent No.: US 6,420,018 B1
(45) Date of Patent: Jul. 16, 2002

(54) LOW THERMAL EXPANSION CIRCUIT BOARD AND MULTILAYER WIRING CIRCUIT BOARD

(75) Inventors: Yasushi Inoue; Masakazu Sugimoto; Amane Mochizuki, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/697,301

(22) Filed: Oct. 27, 2000

Related U.S. Application Data

(62) Division of application No. 09/166,419, filed on Oct. 5, 1998, now Pat. No. 6,180,261.

(30) Foreign Application Priority Data

Oct. 21, 1997 (JP) .............................................. 9-288798

(51) Int. Cl.[7] .............................. B32B 3/00; H05K 1/00
(52) U.S. Cl. .................... 428/209; 428/458; 428/473.5; 428/901; 428/213; 174/256; 174/259; 174/260; 361/748; 361/760
(58) Field of Search ................................. 428/209, 458, 428/473.5, 901, 213; 361/748, 760, 762; 174/256, 259, 260

(56) References Cited

U.S. PATENT DOCUMENTS

| | | | |
|---|---|---|---|
| 4,148,844 A | 4/1979 | Von Bonin et al. | 528/392 |
| 4,353,954 A | 10/1982 | Yamaoka et al. | 428/216 |
| 4,769,270 A | 9/1988 | Nagamatsu et al. | 428/131 |
| 5,492,863 A | 2/1996 | Higgins, III | 438/610 |
| 5,674,343 A | 10/1997 | Hotta et al. | 156/245 |
| 5,777,386 A | 7/1998 | Higashi et al. | 257/737 |
| 5,821,628 A | 10/1998 | Hotta | 257/783 |
| 5,830,949 A | 11/1998 | Michizuki et al. | 525/452 |
| 5,859,170 A | 1/1999 | Sakamoto et al. | 528/170 |
| 5,916,675 A | 6/1999 | Komoto et al. | 428/355 R |
| 6,008,311 A | 12/1999 | Sakamoto et al. | 528/74 |
| 6,023,096 A | 2/2000 | Hotto et al. | 257/687 |

FOREIGN PATENT DOCUMENTS

| | | |
|---|---|---|
| DE | 44 13 529 A1 | 10/1995 |
| EP | 0186655 * | 7/1986 |
| EP | 0244699 | 11/1987 |
| EP | 0 523 479 A2 | 1/1993 |
| EP | 0 792 897 A1 | 9/1997 |
| EP | 0282078 * | 9/1998 |
| JP | 408148838 A | 6/1996 |
| JP | 408307020 A | 11/1996 |

OTHER PUBLICATIONS

Caers, J., et al., Reliability of flip chip on board first order model for the effect on contact integrity of moisture penetration in the underfill, *Electronic Components and Technology Conference*, 1998, pp. 867–871.

* cited by examiner

Primary Examiner—Deborah Jones
Assistant Examiner—Stephen Stein
(74) Attorney, Agent, or Firm—Whitham, Curtis & Christofferson, PC

(57) ABSTRACT

A low thermal expansion circuit board 1 on which a semiconductor element can be mounted with ease and high reliability, which comprises an insulating layer 3 having an Ni—Fe—based alloy foil or a titanium foil as a core, a wiring conductor 4 on both sides thereof, and an adhesive resin layer 5 on the side on which a semiconductor element is to be mounted.

10 Claims, 6 Drawing Sheets

LOW THERMAL EXPANSION CIRCUIT BOARD AND MULTILAYER WIRING CIRCUIT BOARD

The present application is a divisional application of co-pending U.S. application Ser. No. 09/166,419, filed on Oct. 5, 1998 and now issued as U.S. Pat. No. 6,180,261.

FIELD OF THE INVENTION

The present invention relates to a low thermal expansion circuit board and a multilayer wiring circuit board on which semiconductor elements can be mounted with high reliability and ease.

BACKGROUND OF THE INVENTION

With the recent tendencies for electronic equipment to have a smaller size and higher performance, it has been demanded for semiconductor devices constituting electronic equipment and multilayer printed wiring boards for mounting the devices to have a reduced size, high performance and high reliability. To meet these demands pin insertion mounting is being displaced by surface mounting, and, in recent years, a surface mount technology called bare chip mount has been under study, in which bare semiconductor elements are directly mounted on a printed board. The chips used in bare chip mount, which are not packaged, are usually encapsulated with an encapsulating resin called an underfilling material. The main object of the underfilling material is to disperse the stress produced by the difference in coefficient of thermal expansion between a circuit board and a semiconductor element. Therefore the underfilling material must keep a certain modulus of elasticity even in high temperature. From this viewpoint, thermosetting resins are usually used as an underfilling material.

The underfilling material (usually a thermosetting resin) is generally cast in the gap under a semiconductor element bonded to a circuit board, followed by post curing. However, the conventional technique involves various problems such as a low yield, a long post curing time, and poor repairability. It has therefore been demanded to develop a circuit board on which semiconductor elements can be mounted easily with high reliability.

SUMMARY OF THE INVENTION

An object of the present invention is to provide a low thermal expansion circuit board and a multilayer wiring circuit board on which semiconductor elements can be mounted with ease and high reliability.

The above object is accomplished by a low thermal expansion circuit board comprising an insulating layer having an Ni—Fe—based alloy foil or a titanium foil as a core, a wiring conductor on both sides thereof, and an adhesive resin layer on the side on which a semiconductor element is to be mounted (hereinafter simply referred to as a mount side).

The object is also accomplished by a multilayer wiring circuit board having a plurality of low thermal expansion circuit boards laminated integrally each comprising an insulating layer having an Ni—Fe—based alloy foil or a titanium foil as a core, a wiring conductor on both sides thereof, and an adhesive resin layer on the mount side thereof.

In order to develop a circuit board meeting the above-mentioned object, the inventors of the present invention have conducted extensive studies. They aimed chiefly at reduction of the thermal expansion coefficient of a circuit board itself, taking the trend into consideration that semiconductor elements will increase in size. As a result, they have found that the coefficient of thermal expansion of a circuit board approaches that of a semiconductor element by using an insulating layer having an Ni—Fe—based alloy or titanium foil as a core whereby the stress generated from the difference in thermal expansion coefficient between the circuit board and the semiconductor element can be diminished, enabling highly reliable bare chip mount. They have additionally found that a semiconductor element can be mounted and encapsulated extremely easily when an adhesive resin layer is previously provided on the mount side of the circuit board. The ease and high reliability in bare chip mounting are similarly enjoyed in the multilayer wiring circuit board comprising a plurality of such low thermal expansion circuit boards.

It is preferred for the adhesive resin layer to mainly comprise a thermoplastic resin or polycarbodiimide having a skeleton represented by formula (I):

$$-(\!(R\!-\!N\!=\!C\!=\!N)\!)_{\overline{n}}- \qquad (I):$$

wherein R represents a divalent organic group; and n represents an integer of 2 to 100.

In this case, the resin layer easily softens on re-heating so that a semiconductor element once mounted thereon can easily be detached. In other words, the circuit board has excellent repairability.

DETAILED DESCRIPTION OF THE INVENTION

Figure 1:
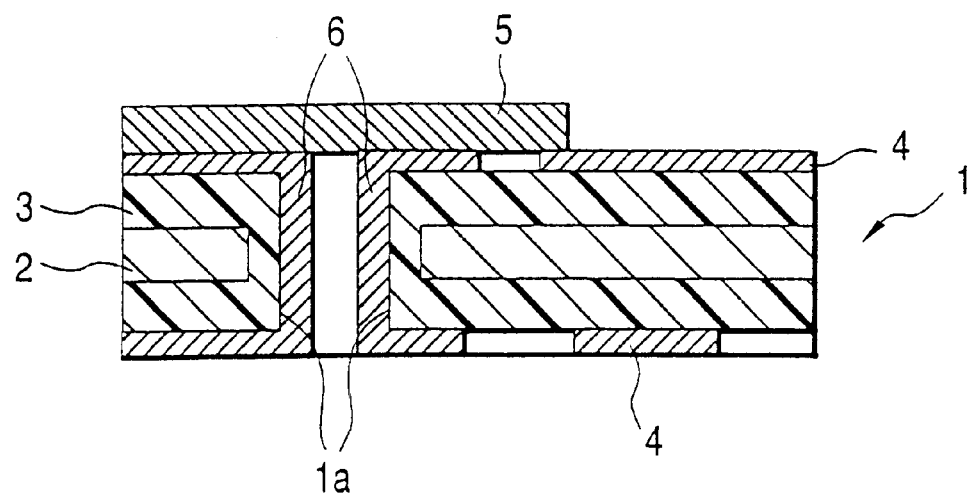
FIG. 1 is a cross sectional view of an example of the low thermal expansion circuit board according to the present invention.

An example of the low thermal expansion circuit board according to the present invention is shown in FIG. 1. The low thermal expansion circuit board 1 comprises an insulating layer 3 having an Ni—Fe—based alloy or titanium foil 2 as a core, a wiring conductor (i.e., a circuit) 4 on both sides thereof, and an adhesive resin layer 5 on the mount side thereof. The circuit board 1 has a through-hole 1a, the inner wall of which is covered with a copper deposit layer 6 formed by plating to electrically connect the wiring conductors (circuits) on both sides.

The Ni—Fe—based alloy foil 2 (or titanium foil 2), which is a core of the insulating layer 3, serves to suppress thermal expansion of the insulating layer 3 and the wiring conductors 4 to thereby decrease thermal expansion of the circuit board 1 as a whole. Therefore, the core 2 should have a sufficiently small coefficient of thermal expansion.

The thermal expansion coefficient of an Ni—Fe—based alloy foil is subject to variation depending on the composition. A suitable Ni content ranges from 31 to 50% by weight, preferably 31 to 45% by weight. If the Ni content is out of the range of 31 to 50%, the foil has a high thermal expansion coefficient, and it is difficult to suppress thermal expansion of the circuit board as a whole.

The titanium foil includes commercially available pure titanium foil and titanium alloy foil. The titanium alloy comprises Ti as a main component and other metals such as Al, V, Cr, Mn, Sn, and Zr. These titanium foils have a thermal expansion coefficient of about 8.8 to 9.0 ppm/° C. and are characterized by a low specific gravity (about 4.5) and excellent anticorrosion.

The core preferably has a thickness of 10 to 300 μm. With a thickness smaller than 10 μm, it is difficult to suppress thermal expansion of the whole circuit board. If the thickness exceeds 300 μm, the processability of the foil is reduced, and the through-hole plating, which is necessary in preparing a circuit board or a multilayer wiring circuit board, is less reliable.

Electrical connection of the wiring conductors formed on each side of the circuit board having the Ni—Fe—based alloy or titanium foil as a core is conducted by a known technique of through-hole plating.

The material for forming the insulating layer 3 is not particularly limited and includes, for example, organic high polymers. Suitable organic high polymers include polyimide resins such as polyimide and polyether imide, polyether sulfone resins, epoxy resins, phenol resins, and aramid resins, with polyimide resins being preferred.

While not limiting, copper is usually used as a metallic material for constituting a wiring conductor (circuit) 4. Other metals such as gold and silver are also employable.

The material of the adhesive resin layer 5, provided on the mount side of the low-expansion circuit board 1, is not particularly limited. Suitable resins include thermosetting resins such as epoxy resins, thermoplastic resins such as polyether imide and phenoxy resins, and polycarbodiimide. In particular, thermoplastic resins and polycarbodiimide are preferred from the standpoint of repairability in surface mounting because they easily softens on reheating to allow a semiconductor element once mounted thereon to be detached easily.

The polycarbodiimide as referred above is not particularly limited and includes those having a skeleton represented by formula (I):

(I)

wherein R represents a divalent organic group; and n represents a positive integer of 2 to 100, preferably 5 to 50.

The above-described polycarbodiimide is an adhesive resin having low hygroscopicity, which is synthesized by known processes. For example, it is. synthesized by reacting an organic diisocyanate in an organic solvent in the presence of a catalyst for carbodiimidation as disclosed in L.M. Alberino, et al., *J. Appl. Polym. Sci.*, Vol. 21, pp1999 (1977), JP-A-2-292316 and JP-A-4-275359 (the term "JP-A" means an "unexamined published Japanese patent application"). Specific but non-limiting examples of the organic diisocyanates are 2,4-tolylene diisocyanate, 2,6-tolylene diisocyanate, 1-methoxyphenyl-2,4-diisocyanate, 4,4'-diphenylmethane diisocyanate, 3,3'dimethoxy-4,4'-diphenylmethane diisocyanate, 3,3'-dimethyl-4,4'-diphenylmethane diisocyanate, 4,4'-diphenyl ether diisocyanate, 3,3'-dimethyl-4,4'-diphenyl ether diisocyanate, and o-tolylene diisocyanate. These diisocyanate compounds can be used either individually (to provide a homopolymer) or as a mixture of two or more thereof (to provide a copolymer).

The organic diisocyanate is obtainable by a process comprising reacting a corresponding diamine with phosgene, diphenyl carbonate, carbonyldiimidazole, etc., a process comprising Curtius rearrangement of a dicarboxylic acid or a process comprising thermal decomposition of a corresponding urethane, as disclosed in G. Greber, et al., *Angew. Int. Ed.*, Vol. 7, No. 12, p. 941 (1968), and V.L.K. Valli, et al., *J. Org. Chem.*, Vol. 60, p. 257 (1995).

The diamine which can be used as a starting material preferably includes, while not limiting, aromatic diamines, such as 2,2-bis(4-aminophenoxyphenyl)propane, 2,2-bis(4-aminophenoxyphenyl)hexafluoropropane, 1,3- or 1,4-bis(4-aminophenoxy)benzene, 2,4- or 2,6-diaminotoluene, diaminodiphenylmethane, 4,4'diamino-2,2'-dimethylbiphenyl, and 4,4'-diamino-2,2'-bis (trifluoromethyl)biphenyl. They can be used either individually or as a mixture of two or more thereof (to provide a copolymer).

The solvent, in which the isocyanate is reacted, is not particularly limited and includes halogenated hydrocarbons, such as tetrachloroethylene, 1,2-dichloroethane, and chloroform; ketones, such as acetone, methyl ethyl ketone, methyl isobutyl ketone, and cyclohexanone; and cyclic ethers, such as tetrahydrofuran and dioxane. They can be used either individually or as a mixture of two or more thereof.

The catalyst for carbodiimidation is not particularly limited and includes phosphorene oxides, such as 1-phenyl-2phosphorene-1-oxide, 3-methyl-2-phosphorene-1-oxide, 1-ethyl-2-phosphorene-1-oxide, and 3-ethyl-2-phosphorene-1-oxide, and the corresponding 3-phosphorene oxides.

The polycarbodiimide thus synthesized is highly reliable due to its very low hygroscopicity. Further it is suited for high frequency because of its dielectric constant as low as 3.0 or less. Furthermore it is excellent in storage properties because it can be stored at room temperature after solvent removal. Therefore, the circuit board can be handled with extreme ease with no necessity of transporting or storing at low temperatures. Additionally the polycarbodiimide can have its glass transition temperature (Tg) adjusted arbitrarily in conformity with the solder used for bonding.

Figure 2:
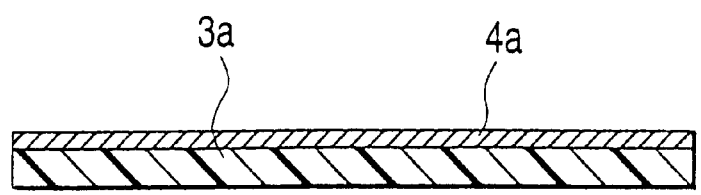
FIG. 2 is a cross sectional view of a copper-clad polyimide layer.
Figure 3:
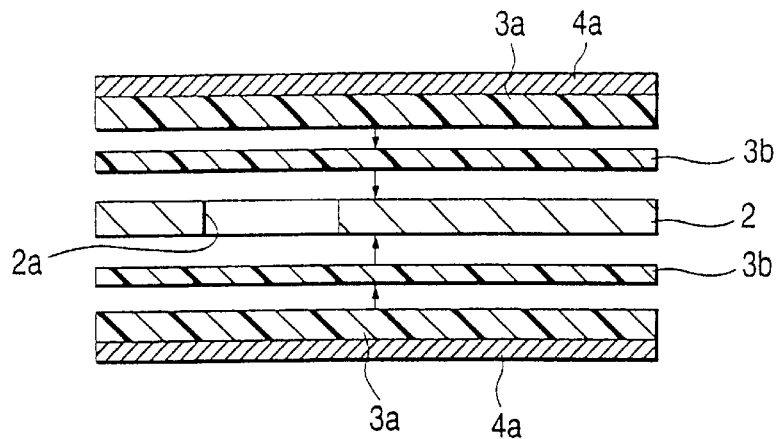
FIG. 3 is a cross sectional view showing preparation of the low thermal expansion circuit board according to the present invention.
Figure 4:
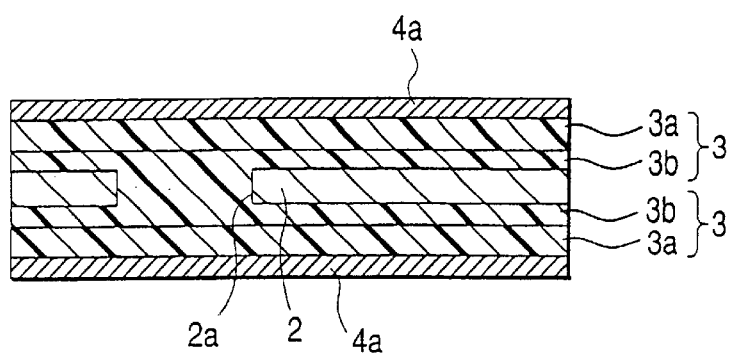
FIG. 4 is a cross sectional view of a precursor of the low thermal expansion circuit board according to the present invention.
Figure 5:
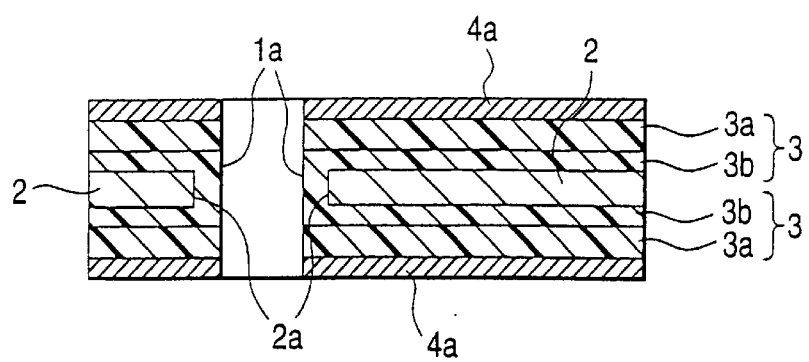
FIG. 5 is a cross sectional view of a precursor of the low hermal expansion circuit board according to the present invention.
Figure 6:
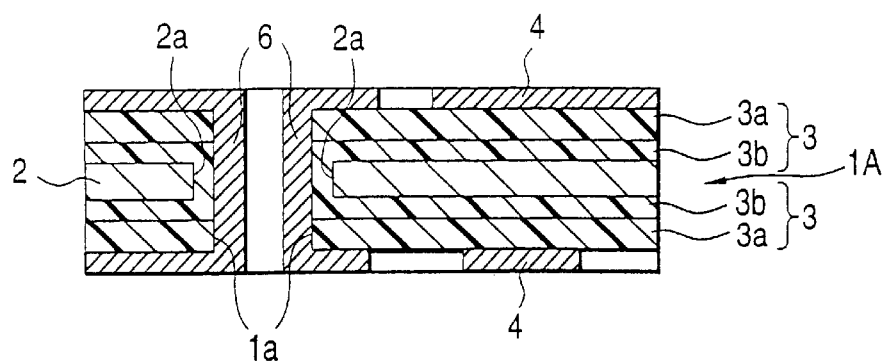
FIG. 6 is a cross sectional view of the low thermal expansion circuit board according to the present invention.

The low thermal expansion circuit board 1 shown in FIG. 1 is produced, for example, as follows. An insulating layer-forming material such as a polyimide precursor varnish is applied to a copper foil 4a having a predetermined thickness, dried, and allowed to imidate at a prescribed temperature for a prescribed time in a nitrogen atmosphere to form a polyimide layer 3a having a predetermined thickness as shown in FIG. 2. As shown in FIG. 3, a through-hole 2a is made through an Ni—Fe—based alloy foil (or a titanium foil) 2 having a prescribed thickness at a predetermined position (corresponding to the through-hole 1a of FIG. 1) with a drill, a punch, etc., and the copper foil 4a having the polyimide layer 3a shown in FIG. 2 is adhered on each side of the foil 2 via a polyimide adhesive sheet 3b by pressing under heat to obtain a low thermal expansion double sided board shown in FIG. 4, in which the polyimide layer 3a and the polyimide adhesive sheet 3b make up an insulating layer 3. A through-hole 1a is made through the double sided board at a position corresponding to the through-hole 2a of the foil 2 with a drill, etc., the diameter of the through-hole 1a being somewhat smaller than that of the through-hole 2a as shown in FIG. 5. The inner wall of the through-hole 1a is plated with copper to a prescribed thickness to form a deposit layer 6, and a prescribed wiring pattern is formed by, for example, etching the copper foil 4a on each side to form a circuit 4 thereby to prepare a low-expansion circuit board 1A shown in FIG. 6. The circuits 4 on both sides of the insulating layer 3 are electrically connected through the deposit layer 6.

A resin material for forming the adhesive resin layer 5, such as a thermoplastic resin, is dissolved in an organic solvent, and the resin solution is directly applied to the mount side of the low thermal expansion circuit board 1A and dried by heating to obtain a low thermal expansion circuit board 1 having the adhesive resin layer 5 on the mount side thereof, shown in FIG. 1.

Formation of the adhesive resin layer 5 is not limited to the above-described method. For example, it can be formed by transferring an adhesive resin layer 5 separately formed on a release film, such as a silicone-treated polyethylene terephthalate (PET) film, to the insulating layer 3 by hot pressing and stripping the PET film. The adhesive resin layer 5 can be provided on either part of the mount side as shown in FIG. 1 or the entire surface of the mount side.

Figure 7:
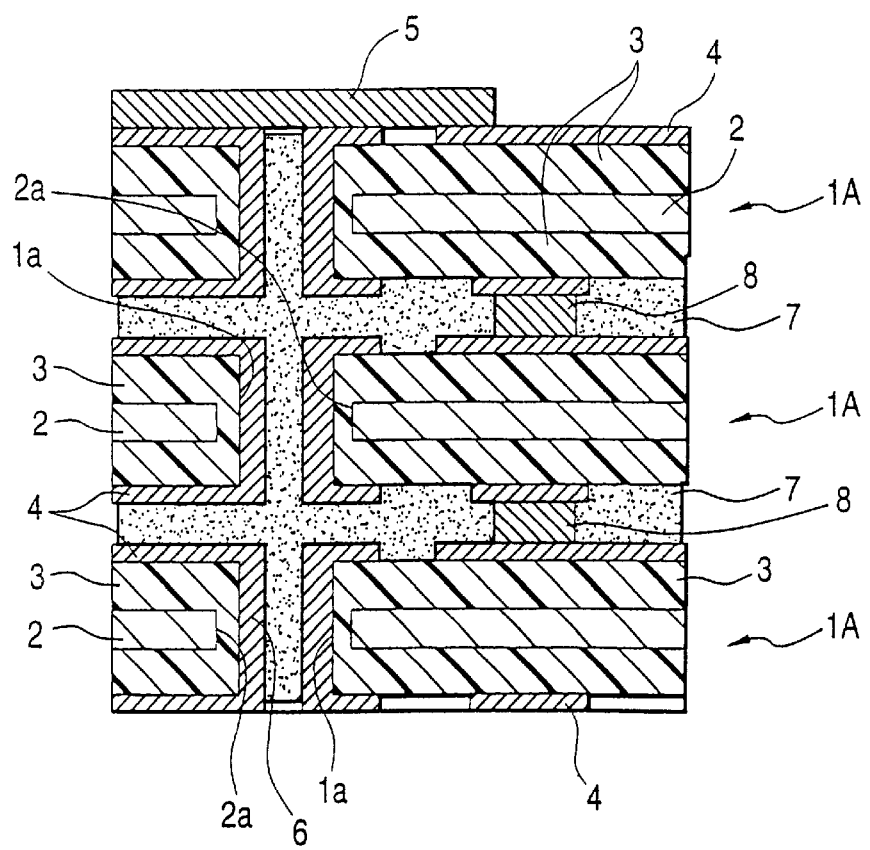
FIG. 7 is a cross sectional view of an example of the multilayer wiring circuit board according to the present invention.

FIG. 7 shows an example of the multilayer circuit board according to the present invention which comprises three low thermal expansion circuit boards 1A laminated via an adhesive layer 7, with an adhesive resin layer 5 provided on the mount side. The structure of the other parts is the same as in the low thermal expansion circuit board 1 of FIG. 1, and the same parts bear the same reference symbols or numerals as used for the circuit board 1. Numeral 8 indicates a conductor made of solder which electrically connects every adjacent circuit boards 1A.

The adhesive forming the adhesive layer 7 includes polyimide adhesives, epoxy adhesives, polyimide-epoxy mixed adhesives, and polyether imide adhesives, with polyimide adhesives being preferred.

Figure 8:
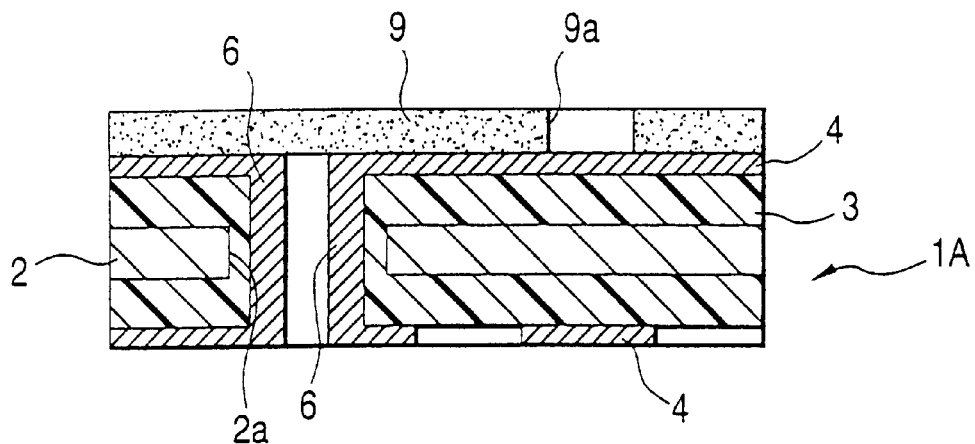
FIG. 8 is a cross sectional view of the low thermal expansion circuit board of FIG. 6 with an adhesive resin sheet adhered thereon provisionally.
Figure 9:
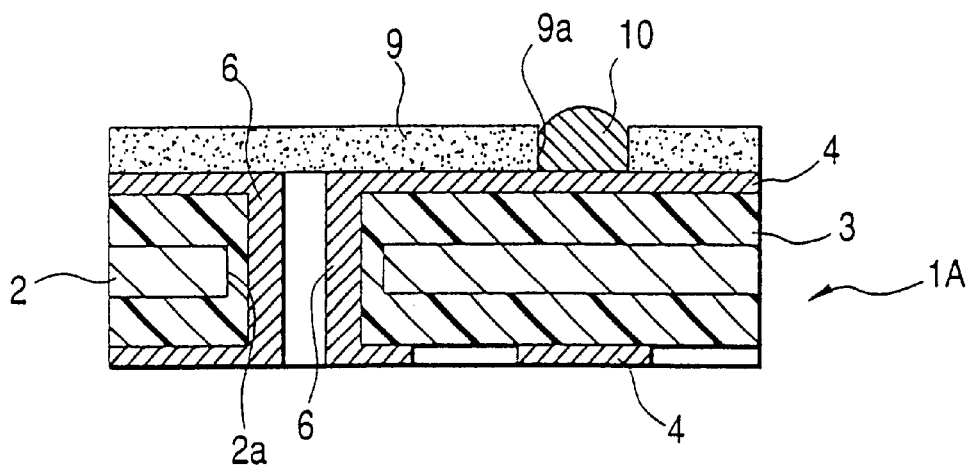
FIG. 9 is a cross sectional view of the low thermal expansion circuit board of FIG. 8 having a soldering bump in the hole of its adhesive sheet.
Figure 10:
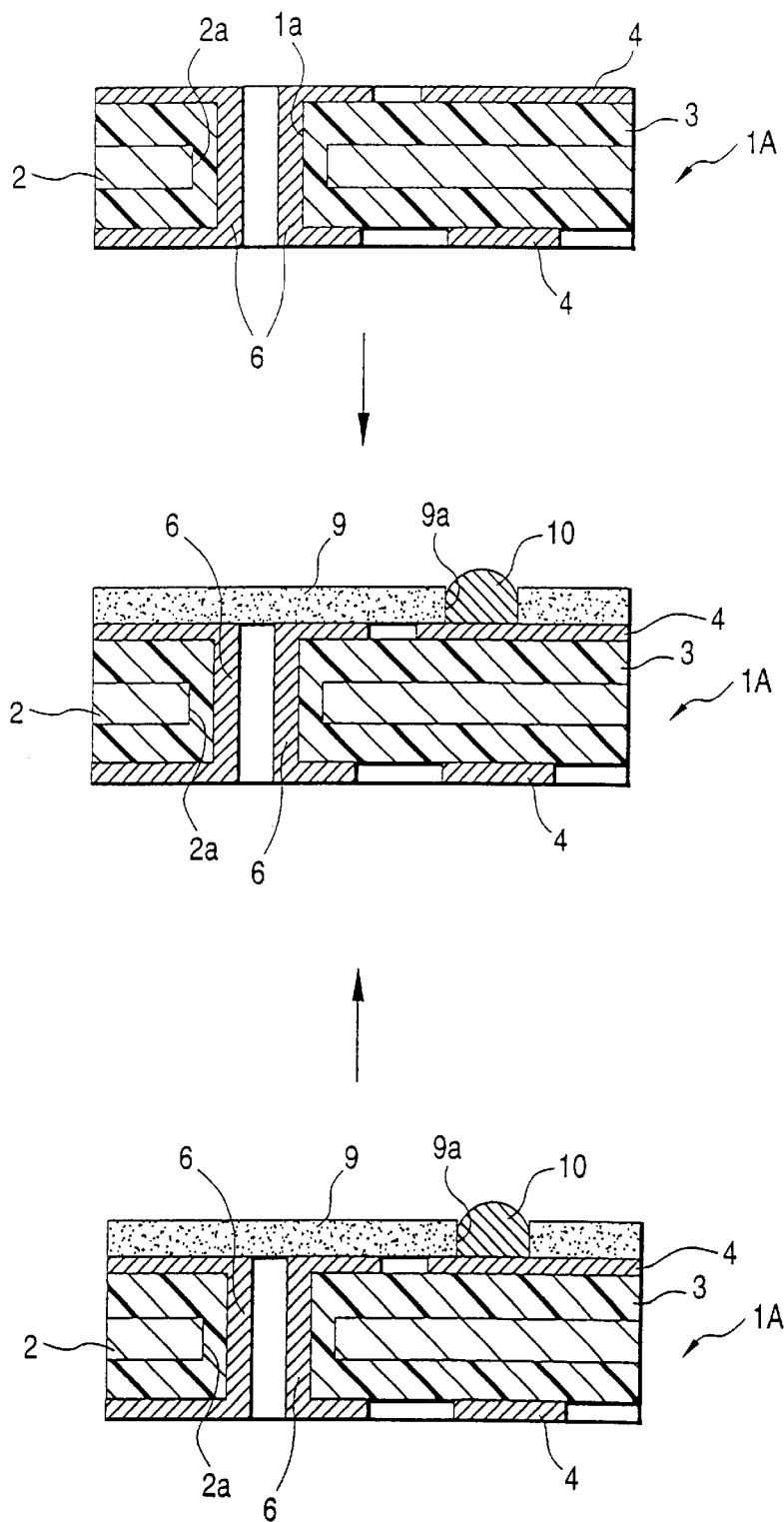
FIG. 10 is a cross sectional view showing preparation of a multilayer wiring circuit board according to the present invention.

The multilayer circuit board shown in FIG. 7 can be produced, for example, as follows. Low thermal expansion circuit boards 1A are prepared in the same manner as described above. Polyimide adhesive sheets 9 each having an opening 9a are prepared, which each serve as the adhesive layer 7. As shown in FIG. 8, the polyimide adhesive sheet 9 is provisionally adhered to the upper side of the low thermal expansion circuit board 1A with its opening 9a at a prescribed position of the circuit 4 of the circuit board 1A (the position where the conductor 8 is to be formed by soldering). As shown in FIG. 9, the opening 9a is filled with soldering paste by screen printing, and the soldering paste is melted by heating to form a soldering bump 10. As shown in FIG. 10, two low thermal expansion circuit boards 1A each having the adhesive sheet 9 and the soldering bump 10 and a low thermal expansion circuit board 1A having neither the adhesive sheet 9 nor the soldering bump 10 as a top circuit board are laminated at prescribed positions and united into one body by hot-pressing. Thus each polyimide adhesive sheet 9 becomes the adhesive layer 7 (see FIG. 7), and each soldering bump 10 becomes the conductor 8 (see FIG. 7). Finally, an adhesive resin layer 5 is formed on the top circuit board 1A in the same manner as described above to obtain a multilayer circuit board shown in FIG. 7.

Besides being formed by screen printing, the soldering bumps 10 can be formed otherwise. For example, a soldering ball is attached using a flux and made to reflow to form the bump 10.

It is possible to previously form a soldering bump 10, for bonding a semiconductor element, on the mount side of the low thermal expansion circuit board 1 or the multilayer circuit board either by screen printing or using soldering balls. By this manipulation, the necessity of forming a soldering bump on a semiconductor element can be excluded to simplify the mounting step.

Because the insulating layer contains an Ni—Fe—based alloy foil or a titanium foil as a core, the thermal expansion coefficient of the circuit board itself is close to that of a semiconductor element (silicon). Therefore, no appreciable stress is generated between the circuit board and the semiconductor element mounted thereon, achieving highly reliable bare chip mounting. There is no need to consider stress relaxation by an underfilling material so that it does not matter if the modulus of elasticity of an underfilling material is reduced at high temperatures as long as a physical bonding strength is retained. Further, the adhesive resin layer provided on the mount side makes it extremely easy to mount and seal a semiconductor element.

Where the adhesive resin layer mainly comprises a thermoplastic resin or polycarbodiimide having the skeleton represented by formula (I), the circuit board exhibits excellent repairability because the adhesive resin layer easily softens on re-heating so that a semiconductor element once mounted can be detached with ease.

Where soldering bumps for bonding a semiconductor element are previously formed on the low thermal expansion circuit board of the present invention, it is no more necessary to form soldering bumps on the semiconductor element to be mounted, thus simplifying the mounting step further.

The low thermal expansion circuit board and multilayer circuit board according to the present invention are suitable as a substrate board for multi chip modules.

The present invention will now be illustrated in greater detail with reference to Examples, but it should be understood that the present invention is not construed as being limited thereto. Unless otherwise noted, all the percents are by weight.

EXAMPLE 1

A polyimide precursor varnish (a polyamic acid varnish obtained by reacting p-phenylenediamine and 3,3',4,4'-biphenyl-tetracarboxylic acid dianhydride in N-methylpyrrolidone) was applied to a 18 μm thick copper foil 4a, dried, and heated at 400° C. in a nitrogen atmosphere for 1 hour to form a polyimide layer 3a having a thickness of 20 μm (see FIG. 2).

A 50 μm thick 42 alloy foil 2 (Ni: 42%; Fe: 58%; thermal expansion coefficient: 4.5 ppm/° C.) having holes 2a made with a drill of 0.3 mm in diameter at prescribed positions was prepared, and the copper/polyimide laminate above prepared was bonded to each side of the foil 2, with its copper foil outside, via a polyimide adhesive sheet 3b (SPB-035A, produced by Nippon Steel Chemical Co., Ltd.) by hot-pressing at 200° C. under a pressure of 40 kg/cm² for 1 hour (see FIG. 3) to obtain a low-expansion double sided board, in which the polyimide layer 3a and the polyimide adhesive sheet 3b formed an insulating layer 3 (see FIG. 4). Through-holes 1a were made through the double sided board with a drill having a diameter of 0.2 mm (see FIG. 5) at positions corresponding to the holes 2a of the foil 2. The inner wall of each through-hole 1a was plated with copper to form a copper deposit layer 6, and the copper foil 4a on each side was etched to form a circuit 4 having a prescribed pattern to prepare a low thermal expansion circuit board 1A (see FIG. 6). The low thermal expansion circuit board thus obtained had a coefficient of thermal expansion a of 7.5 ppm/° C.

Separately, a polycarbodiimide solution prepared as follows was applied on a release film (a silicone-treated PET film) with an applicator to a dry thickness of 100 μm and dried at 120° C. for 30 minutes. The polycarbodiimide layer side was stuck onto a predetermined position of the mount side of the low thermal expansion circuit board 1A (circuit board 1 shown in FIG. 11) by means of a laminator at 120° C. under a pressure of 10 kg/cm at a speed of 0.2 m/min, and the release film was stripped off to provide the mount side of the circuit board 1 with a 100 μm thick adhesive resin layer 5 (melting temperature: 140° C.). Numeral 11 in FIG. 11 is an electrode.

Figure 11:
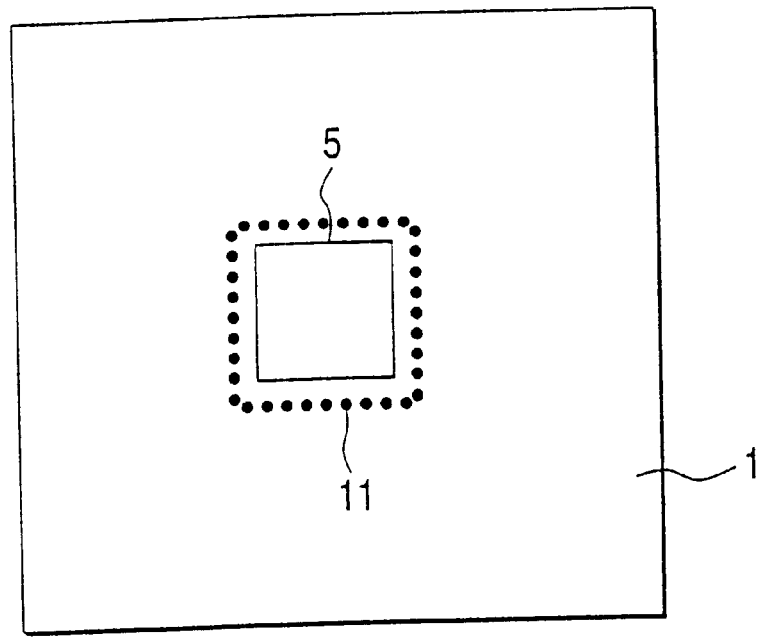
FIG. 11 is a plan view of the low thermal expansion circuit board according to the present invention having electrodes and an adhesive layer formed thereon.
Figure 12:
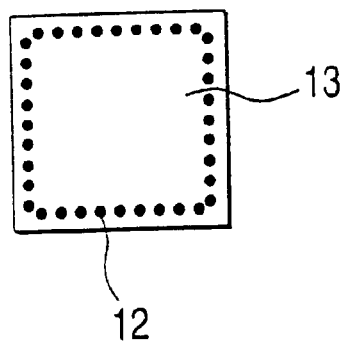
FIG. 12 is a plan view of a silicon chip having soldering balls attached thereto.

A silicon chip 13 with soldering balls 12 (eutectic solder; melting point: 183° C.; ball height: 150 μm) shown in FIG. 12 was bonded to the low thermal expansion circuit board 1 of FIG. 11 by the use of a flip chip bonder (DB-100, manufactured by Shibuya Kogyo K.K.) at 150° C., and the soldering balls 12 were fused at an elevated temperature of 220° C. to bond to the electrodes 11 of the circuit board 1.

Preparation of Polycarbodiimide Solution:

In a 10 l three-necked flask equipped with a dropping funnel were charged 400.0 g (0.777 mol) of 2,2-bis(4-aminophenoxyphenyl)hexafluoropropane, 5300 g of methylene chloride, and 344 g (3.39 mol) of triethylamine. In the dropping funnel was put 242 g (1.54 mol) of phenyl chloroformate, and the reaction vessel was cooled to 0° C. on an ice bath. The phenyl chloroformate was dropped over a 5 minute period, and the reaction mixture was stirred overnight at room temperature. A cooling tube equipped with a calcium chloride cylinder was fitted to the three-necked flask, and 1.04 g (5.40 mmol, 0.70 mol %) of 3-methyl-1-phenylphosphorene-1-oxide (carbodiimidation catalyst) was put into the flask. After displacing the inner atmosphere with argon, 184 g (1.70 mol) of trimethylchlorosilane was added at room temperature, followed by stirring for 10 minutes. The reaction temperature was slowly raised from room temperature up to 80° C. over 2 hours while replacing methylene chloride with an equal amount of toluene, and the reaction mixture was stirred for 4 hours at that temperature. After confirming completion of carbodiimidation by IR analysis, 205 g (1.54 mol) of m-tolyl isocyanate was added, and the reaction mixture was further stirred at 80° C. for 1.5 hours. The reaction mixture was poured into 30 kg of isopropyl alcohol while stirring, and the precipitate thus formed was collected and dried under reduced pressure to give 360 g (yield: 90%) of polycarbodiimide as white powder. The resulting polymer was soluble in an organic solvent and had a number average molecular weight of 4200 and a weight average molecular weight of 15000. A 300 g portion of the polycarbodiimide was dissolved in 450 g of toluene at room temperature to prepare a polycarbodiimide solution.

EXAMPLE 2

A low thermal expansion circuit board 1A (with no adhesive resin layer 5) was prepared in the same manner as in Example 1. Holes 9a were made through an adhesive sheet 9 (SPB-035A, produced by Nippon Steel Chemical Co., Ltd.) with a drill (diameter: 0.2 mm) at positions corresponding to the electrodes 11 of the circuit board 1 (see FIG. 11). The adhesive sheet 9 was bonded at 180° C. under a pressure of 30 kg/cm$^2$ for 30 minutes onto a right position of the circuit board 1A. The holes 9a of the adhesive sheet 9 were filled with soldering paste (Sn820RA-3AMQ, produced by Nippon Superior K.K.; melting point: 240° C.) by screen printing, and the soldering paste was fused at 270° C. to form soldering bumps 10 (see FIG. 9). Two low thermal expansion circuit boards 1A each having soldering bumps 10 and a low thermal expansion circuit board 1A having neither the adhesive sheet 9 nor the soldering bump 10 as a top circuit board were laminated at prescribed positions and united into one body by hot-pressing (see FIG. 10). The thermal expansion coefficient α of the laminated circuit board was 7.5 ppm/° C. Finally, an adhesive resin layer 5 was formed on the top circuit board 1A in the same manner as in Example 1 to prepare a multilayer circuit board (see FIG. 7). A silicon chip with soldering balls (melting point: 183° C.) was bonded on the top circuit board 1A in the same manner as in Example 1.

EXAMPLE 3

A low-expansion circuit board 1A (a: 7.5 ppm/° C.) was prepared in the same manner as in Example 1. The same polycarbodiimide solution as used in Example 1 was applied on the entire surface of the mount side of the circuit board 1A to a dry thickness of 80 μm and dried to form an adhesive resin layer 5. A silicon chip was mounted thereon in the same manner as in Example 1.

EXAMPLE 4

A low thermal-expansion circuit board was prepared in the same manner as in Example 1, except for replacing the 42 alloy foil with a 50 μm thick titanium foil (thermal expansion coefficient: 8.8 ppm/° C.). A 100 μm thick adhesive resin layer 5 (melting temperature: 140° C.) comprising polycarbodiimide was formed in the same manner as in Example 1. The resulting low thermal expansion circuit board had a thermal expansion coefficient a of 11.0 ppm/° C. A silicon chip with soldering balls was mounted thereon in the same manner as in Example 1.

COMPARATIVE EXAMPLE 1

A silicon chip was mounted on a circuit board in the same manner as in Example 1, except for using a conventional glass-epoxy laminate (α: 17.0 ppm/° C.) in place of the low thermal expansion circuit board 1.

Since the low thermal expansion circuit boards of Examples 1 to 4 previously have on the mount side thereof an adhesive resin layer 5 for mounting semiconductor elements, sealing of the gap between a circuit board and a semiconductor element can be achieved easily without involving such steps as casting an underfilling material after mounting a semiconductor element, which have been required in conventional surface mounting.

The circuit boards obtained in Examples 1 to 4 and Comparative Example 1 on which a semiconductor element had been mounted were subjected to a heat cycle test (−65° C./125° C., 30 minutes each) to evaluate connection reliability. As a result, a connection failure did not occur in Examples 1 to 4 after 1000 cycles, whereas a connection failure developed in Comparative Example 1 at about 80% of the contact points after 1000 cycles. It was thus proved that the low thermal expansion circuit board according to the present invention makes it possible to carry out bare chip mounting extremely easily while securing high connection reliability.

When the circuit boards of Examples 1 to 4 were heated to 220° C., the adhesive resin layer melted so that the silicon chip could be removed easily without damaging the circuit board. It can be said that the circuit board according to the present invention has excellent repairability.

While the invention has been described in detail and with reference to specific examples thereof, it will be apparent to one skilled in the art that various changes and modifications can be made therein without departing from the spirit and scope thereof.

What is claimed is:

1. A low thermal expansion circuit board comprising an insulating layer having a titanium foil as a core, a wiring conductor on both sides thereof, and an adhesive resin layer on the side on which a semiconductor element is to be mounted.

2. The low thermal expansion circuit board according to claim 1, wherein said adhesive resin layer comprises a thermoplastic resin.

3. The low thermal expansion circuit board according to claim 1, wherein said adhesive resin layer comprises polycarbodiimide having a skeleton represented by formula (I):

$$((R-N=C=N))_n \qquad (I)$$

wherein R represents a divalent organic group; and n represents an integer of 2 to 100.

4. The low thermal expansion circuit board according to claim 1, wherein said core has a thickness of 10 to 300 μm.

5. The low thermal expansion circuit board of claim 1, wherein said titanium foil core has a thermal expansion coefficient of approximately 8.8 to 9.0 ppm/° C.

6. A multilayer circuit board having a plurality of low thermal expansion circuit boards laminated integrally, wherein the low thermal expansion circuit boards each comprise an insulating layer having a titanium foil as a core, a wiring conductor on both sides thereof, and an adhesive resin layer on the side on which a semiconductor element is to be mounted, the wiring conductors on both sides being electrically connected via through-holes of said insulating layer.

7. The multilayer circuit board according to claim 6, wherein said adhesive resin layer comprises a thermoplastic resin.

8. The multilayer circuit board according to claim 6, wherein said adhesive resin layer comprises polycarbodiimide having the skeleton represented by formula (I):

$$((R-N=C=N))_n \qquad (I)$$

wherein R represents a divalent organic group; and n represents an integer of 2 to 100.

9. The low thermal expansion circuit board according to claim 6, wherein said core has a thickness of 10 to 300 μm.

10. The multilayer circuit board of claim 6, wherein said titanium foil core has a thermal expansion coefficient of approximately 8.8 to 9.0 ppm/° C.

* * * * *